United States Patent [19]

Reynolds et al.

[11] 3,718,895

[45] Feb. 27, 1973

[54] CONNECTING DEVICE FOR PRINTED CIRCUIT BOARD

[75] Inventors: Charles Edward Reynolds, Camp Hill; Eugene Leonard Gombar, Harrisburg, both of Pa.

[73] Assignee: AMP Incorporated, Harrisburg, Pa.

[22] Filed: Feb. 1, 1971

[21] Appl. No.: 111,402

[52] U.S. Cl. ........339/258 R, 339/17 CF, 339/221 R, 339/275 B

[51] Int. Cl. ..........H01r 5/04, H01r 9/12, H05k 1/02

[58] Field of Search .......339/17 R, 17 C, 18 R, 18 C, 339/256 R, 258 R, 275 B, 220, 221

[56] References Cited

UNITED STATES PATENTS

| | | | |
|---|---|---|---|
| 3,609,640 | 9/1971 | Longenecker et al. | 339/258 P X |
| 3,384,865 | 5/1968 | Bosworth | 339/258 P X |
| 3,543,220 | 11/1970 | Jones | 339/258 P X |
| 3,072,880 | 1/1963 | Olsson | 339/17 R X |
| 3,104,926 | 9/1963 | Scoville | 339/254 M |
| 3,188,599 | 6/1965 | Roberts | 339/275 B X |
| 3,428,934 | 2/1969 | Reider, Jr. et al | 339/17 R X |
| 3,496,516 | 2/1970 | McFadden | 339/17 R X |

*Primary Examiner*—Robert L. Wolfe
*Assistant Examiner*—Terrell P. Lewis
*Attorney*—William J. Keating, Ronald D. Grefe, Gerald K. Kita, Frederick W. Raring, Jay L. Seitchik, John R. Flanagan and Allan B. Osborne

[57] ABSTRACT

Connecting device which is adapted to be mounted on a printed circuit board comprises a box-like receptacle portion which is adapted to receive an electrical lead and a mounting portion extending from one side of the receptacle portion. The mounting portion is cupped along its length in the general form of a hemi-ellipsoid. The interior of the ellipsoidal mounting portion faces laterally with respect to the box-like receptacle portion and is so dimensioned that it will fit snugly within a hole in a printed circuit board. The relationship of the mounting portion to the receptacle portion is such that solder flow into the receptacle portion, when the board is dip soldered or wave soldered is prevented.

6 Claims, 19 Drawing Figures

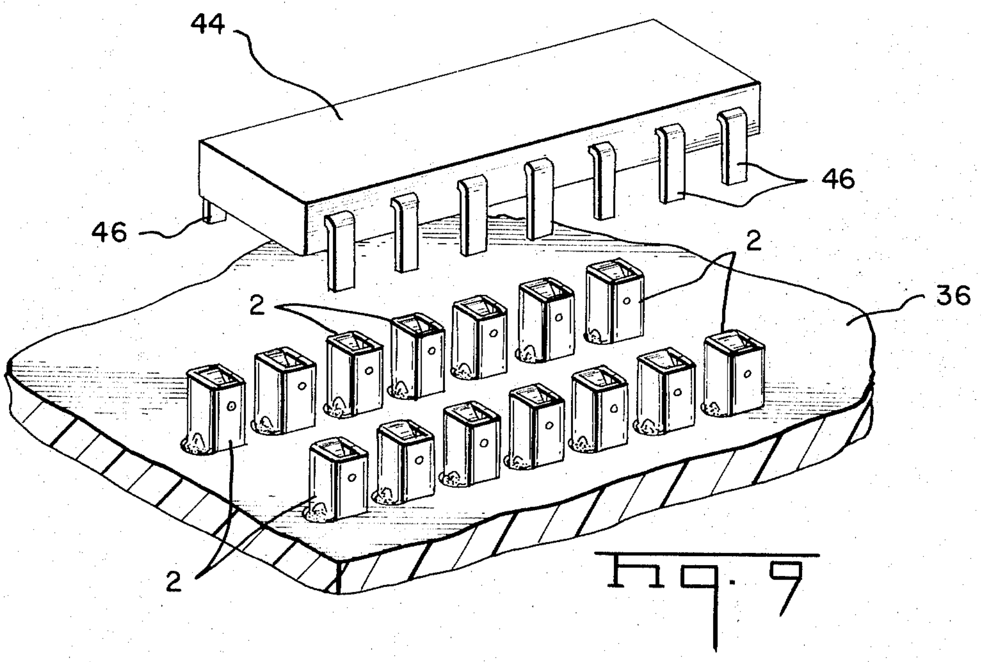
FIG. 9
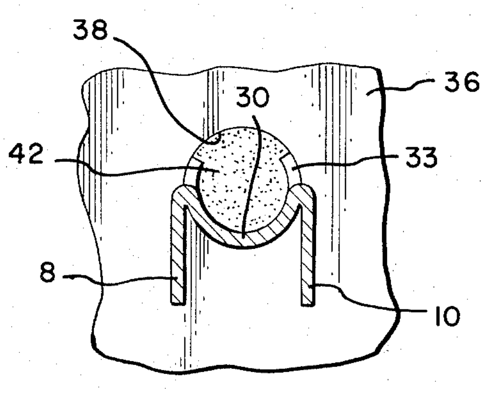
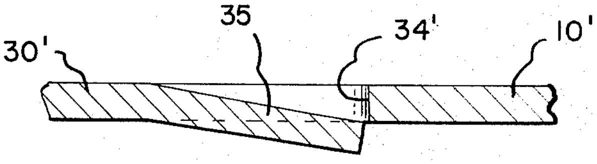
FIG. 13
FIG. 11

CONNECTING DEVICE FOR PRINTED CIRCUIT BOARD

BACKGROUND OF THE INVENTION

This invention relates to electrical connecting devices of the type which are adapted to be mounted on a printed circuit board or the like and particularly to the achievement of a free standing receptacle having improved soldering characteristics for electrical leads such as the leads which extend from an integrated circuit device.

A wide variety of connecting devices have been developed for insertion into printed circuit boards. Such connecting devices may comprise, for example, a receptacle portion which is adapted to receive an external conductor, and a tab or post. The tab or post is adapted to be inserted through a hole in the printed circuit board and soldered to a conductor on one or both sides of the board. Many of the connecting devices which are now known to the art are not free standing, that is they cannot be mounted on the board individually but must be contained in an insulating housing which protects and supports the metallic connecting devices. When the connecting devices are assembled to the board, the housing is positioned against the board with the solder tabs extending through the holes in the printed circuit board and the tabs are then soldered to the conductors of the board by a solder dipping operation. The housing functions to protect the connecting devices and to accurately position them with respect to each other so that they will be properly located to receive the leads extending from a component or integrated circuit device which is adapted to be mounted on the board.

A free standing connecting device is one which can be mounted on the board without the necessity of providing additional support such as that provided by an insulating housing. Various types of free standing connecting devices including receptacles are available but most of these must be staked mechanically to the board after they have been inserted by bending one or two projecting legs laterally after these legs have been inserted through the holes in the board.

The requirement of an insulating housing for connecting devices such as receptacles is objectionable under many circumstances because of the substantial added expense of such housings particularly in the production of consumer items such as television sets or printed circuit boards used for the control of domestic appliances such as washing machines. Furthermore, printed circuit boards for such consumer devices are frequently assembled by production line methods in which the boards move along an assembly line and have various parts such as connecting devices and receptacles inserted at the several stations along the line. The insertion of entire connectors is not as convenient an operation as is the insertion of individual connecting devices. Furthermore, individual connecting devices can be inserted into printed circuit boards at very low cost by high speed inserting machines of known types. For these reasons, it is preferred to insert individual terminals or connecting devices into printed circuit boards in mass production techniques.

Those types of connecting devices or receptacles which are free standing and which must be staked to the printed circuit board avoid the disadvantages discussed above, however, the staking operation itself increases the cost of assembling printed circuit boards having terminals or connecting devices of this type thereon and furthermore, the terminal devices usually cannot be precisely positioned on the board by a simple mechanical staking operation. Usually, the terminal devices are only loosely held in the printed circuit board hole after completion of the staking operation and they are not securely mounted on the board until after they have been soldered to the conductors on the board.

As noted above, the present invention is also directed to the achievement of a printed circuit board connecting device having improved soldering characteristics. By way of background information with regard to this aspect of the invention, it should be recalled that it is common practice to connect printed circuit board connecting devices to the conductors on a printed circuit board by moving the board, having connecting device mounted in holes in the board, over a solder wave in a wave soldering machine. The solder flows into the holes and into the proportions of the connecting devices which extend into the holes to form the electrical connections.

Problems are frequently encountered as a result of solder flowing entirely through the printed circuit board hole and into, or onto, the contact portion of the connecting device which projects above the board surface. When the contact portion of the connecting device is a receptacle for an electrical lead, this unwanted solder flow will frequently partially fill the receptacle and interfere with the contact springs in the receptacle and/or prevent proper insertion of the external lead into the receptacle.

It is accordingly an object of the invention to provide an improved receptacle which is adapted to be mounted on a printed circuit board. A further object is to provide a receptacle which is free standing. A still further object is to provide a free standing receptacle having mounting means integral therewith which firmly secures the receptacle to the board prior to soldering. A further object is to provide an improved connecting device which is manufactured as a one-piece stamping in endless strip form. A further object is to provide a receptacle which can be soldered to a printed circuit board and which has parts so arranged that solder cannot flow into the contact portions of the device. A still further object is to provide a device which can be manufactured in extremely small sizes and which can be assembled to a printed circuit board by known types of insertion machines.

These and other objects of the invention are achieved in a preferred embodiment thereof which is briefly described in the aforegoing abstract, which is described in detail below and which is shown in the accompanying drawings in which.

Figures 1, 2, 3, 4, 5, 6, 7, 10:
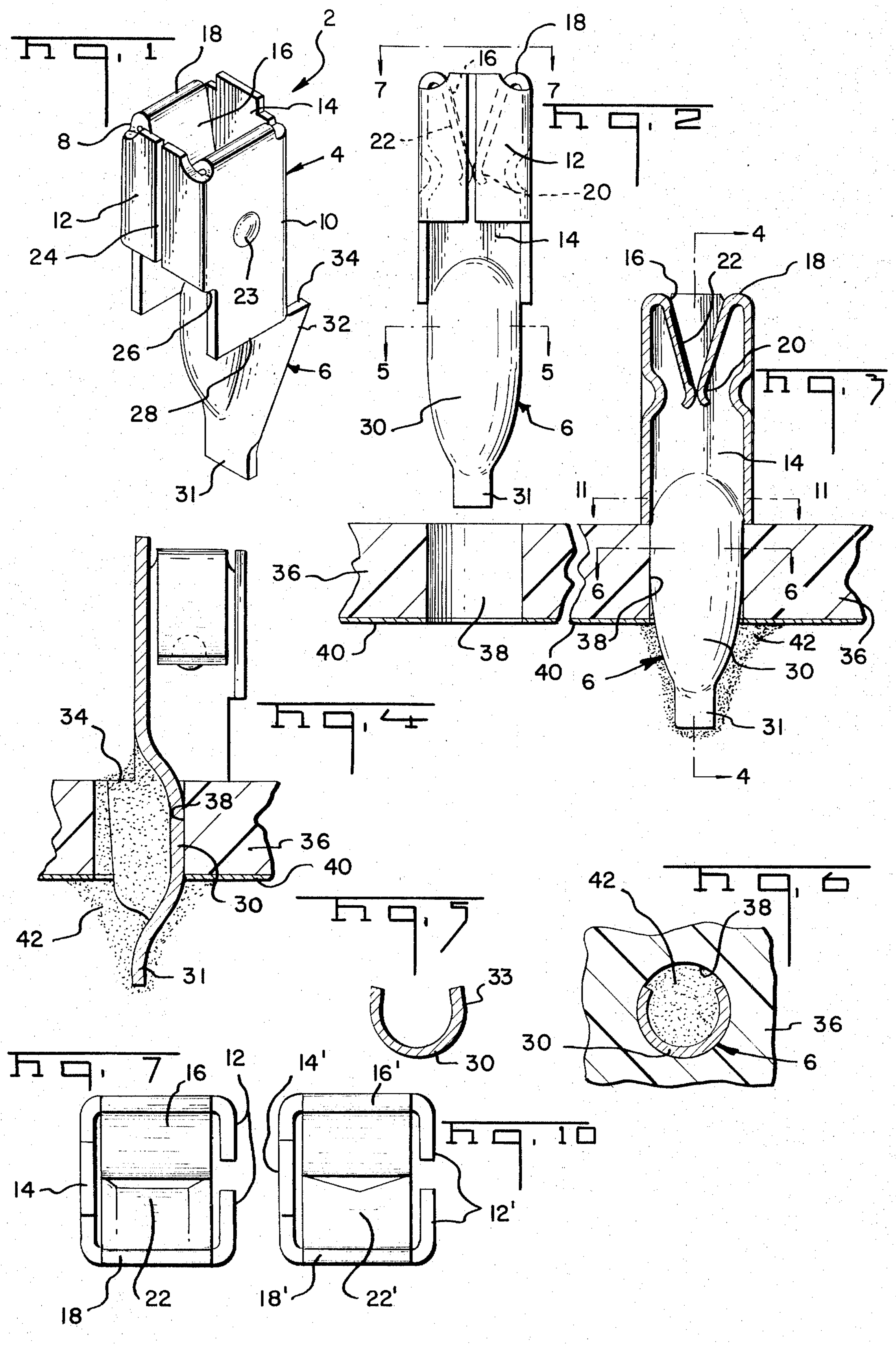
FIG. 1 is a perspective view of a preferred form of receptacle in accordance with the invention.
FIG. 2 is a side view of the receptacle of FIG. 1.
FIG. 3 is a sectional side view of a receptacle which has been inserted and soldered to the conductors of a printed circuit board.

FIGS. 4, 5, 6 and 7 are views taken along the lines 4—4, 5—5, 6—6, and 7—7 of FIGS. 2 and 3.

FIGS. 8A–8F illustrate the successive forming steps in the manufacture of connecting devices in accordance with the invention.

FIG. 9 is a fragmentary perspective view of a plurality of receptacles in accordance with the invention mounted on a printed circuit board and arranged to receive the leads from an integrated circuit device.

FIG. 10 is a top plan view of an alternative form of receptacle in accordance with the invention.

FIG. 11 is a view taken along the lines 11—11 of FIG. 3.

Figures 8A, 8B, 8C, 8D, 8E, 8F, 12A, 12B:
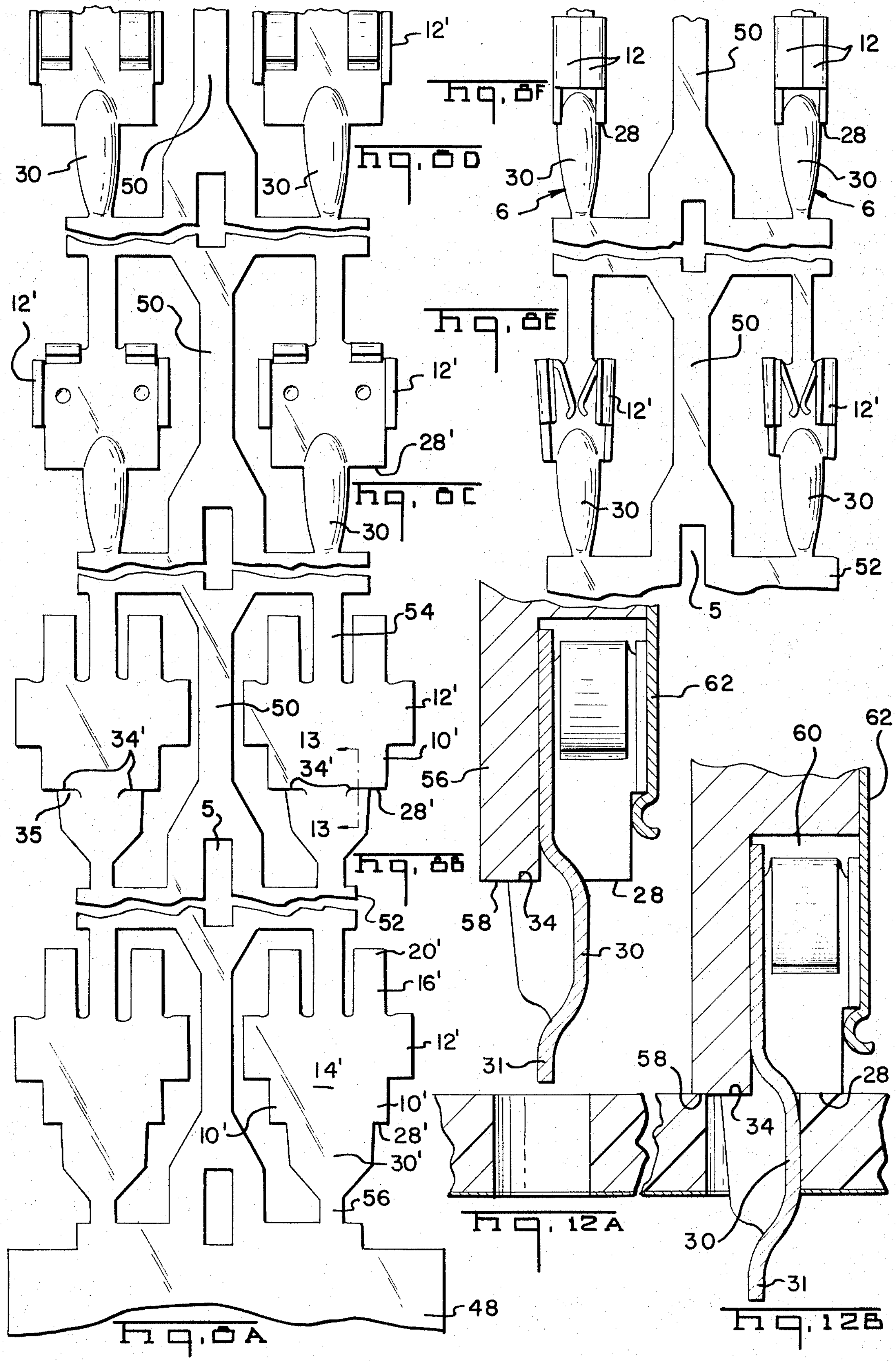

FIG. 12A and 12B illustrate the insertion of a connecting device into a printed circuit board.

FIG. 13 is a view taken along the lines 13—13 of FIG. 8B.

Referring first to FIGS. 1–7, a preferred form of connecting device 2 in accordance with the invention comprises a box-like receptacle 4 having a mounting portion 6 extending from one side thereof. The receptacle portion, which is of the general type disclosed in application Ser. No. 877,352 filed Nov. 17, 1969, now U.S. Patent No. 3,609,604 has a first pair of opposed sides 8, 10 which have extensions 16 on their upper ends as viewed in the drawings. These extensions are reversely bent adjacent to the upper end of the receptacle portion as shown at 18 and extend inwardly towards each other and downwardly within the interior of the receptacle portion. The lower ends of the extensions 20 are disposed substantially against each other so that upon insertion of an external conductor, these extensions will function as contact springs and will be resiliently biased apart while maintaining a continuing contact pressure on the inserted conductor. In the disclosed embodiment, these extensions are relatively wide and tongue-like and are adapted to engage conductors 46 (FIG. 9) extending from an integrated circuit device 44. Advantageously, dimples 23 are provided on the sides 8, 10 adjacent to the lower ends 20 of the contact springs so that if these springs are flexed towards the side walls by the insertion of an oversized test probe or other instrument, they cannot be overstressed but will move against the surfaces of the dimples prior to their being overstressed. The sidewall 12 has an axially extending seam thereon as a result of the forming procedure as described below, and extends only partially downwardly as indicated at 26 toward the lower end 28 of the receptacle portion.

The mounting portion or mounting leg 6 comprises an extension of the sidewall 14 and is inwardly cupped towards the axes of the receptacle portion along its length as shown at 30 in a hemi-ellipsoidal form so that the cross section of this mounting portion is generally semi-circular. By virtue of this hemi-ellipsoidal form, the radius of the semi-circular cross section increases with the distance from the lower end of the cupped portion and decreases in the upper end of the cupped portion, the intermediate portion having the maximum radius. This increasing radius assists in guiding the mounting portion of the device into a printed circuit board hole smoothly notwithstanding the fact that the mounting portion fits snugly within the hole. The extreme lower end of the mounting leg is of reduced width as indicated at 31 so that it can function as a pilot during insertion.

The precise form of the mounting portion, and its relationship to the sides 8, 10, 14 of the receptacle portion, can best be understood from an inspection of FIGS. 8A–8F which shows the blanking and forming steps carried out during manufacture. The strip stock 48 is blanked as shown, the primed reference numerals denoting the areas of the blank which ultimately become the parts of the finished connecting device identified by unprimed numerals in FIGS. 1–7. The mounting portion of the finished connecting device is thus formed from a section 30′ of the blank which adjoins the sections 8′, 14′, 10′ which ultimately become the sides of the receptacle 4. The lower end of this mounting portion of the blank is tapered as shown at and is integral with a connecting neck 56 which, in turn, is integral with a transverse carrier strip 52.

As the strip stock progresses through the forming die, the mounting portion 30′ is sheared from the blank portion 8′, 10′ as indicated by the shear lines 34′ which extend inwardly towards the axis of the blank. As shown in the drawing, these shear lines 34′ curve downwardly at their inner ends so that the end portions of these lines are generally parallel to each other and generally parallel to the axis of the blank. Also, it should be noted that small sections of metal stock adjacent to these shear lines are formed downwardly by a slight amount, see FIG. 13. The curvature on the ends of these shear lines is important in the final forming steps as explained immediately below. In accordance with the preferred embodiment, no metal is removed in this step and the shear lines 34′ are a continuation of the lower edges 28′ of the blank portions 8′, 10′.

During subsequent forming operations the hemi-ellipsoidal form is imparted to the mounting portion 6 by a cupping operation as described above and the sides of blank portion 30′ are bent downwardly as viewed in the drawing. The sides 8, 10 are subsequently formed by bending the blank portions 8′, 10′ upwardly. In the finished connecting device, the lower edges 28 of the sides 8, 10 are thus in alignment with the upper edges 34 of the mounting portion.

As previously noted, the precise form of the shear lines 34′, and particularly the curvature on the ends of these shear lines, is important to the successful practice of the invention. The importance of the curvature of these shear lines can be best understood from FIGS. 8C, 8E, and 11. As shown in FIG. 8C, the sides of the mounting portion 30′ are bent downwardly as viewed in the drawing and the blank portion 10′ is subsequently bent upwardly, see FIG. 8E. These extreme bends, in opposite directions, would ordinarily tend to propagate the shear lines 34′ since the inner ends of these shear lines would act as stress concentration points. The curvatures on the inner ends of these shear lines avoids any extremely high stress concentrations so that the downward bending of the sides of blank portion 30′ and the upward bending of the adjacent portion 10′ of the blank can be carried out successfully.

As a result of the manufacturing steps described above and the resulting structure of connecting devices in accordance with the invention, significant advantages are obtained with respect to the insertion of the connecting devices into printed circuit boards and with respect to the soldering of the connecting devices to the conductors on the board. FIGS. 12A and 12B illustrates the insertion of a connecting device by means of an inserting punch 56 shaped on its lower end to hold the connecting device and apply an inserting force against the edges 34 of the mounting portion 6. The disclosed punch 56 has a recess 60 for the connecting device 2 and a leaf spring 62 to retain the connecting device in the recess. The edges provide bearing surfaces for driving the connecting device into the board without a risk of damage to the more delicate receptacle portion. As is apparent from the drawing, no forces are applied to the receptacle portion during the inserting operation so that it can not be damaged.

As is also apparent from FIGS. 12A and 12B, the surface portions 58 of the inserting 56 punch which engage the edges 34 extend laterally beyond these edges so that when these surface portions move against the printed circuit board, the insertion will stop with the edges 34 flush with respect to the surface of the board. Furthermore, since the lower edges 28 of the sides 8, 10, of the receptacle portions are in alignment with the edges 34, the lower edges 28 will be tightly against the surface of the printed circuit board and the axis of the receptacle portion will extend normally from the board surface so that precise location of the receptacle portion or the board surface is achieved.

A further advantage is achieved in connecting devices in accordance with the invention with regard to preventing the flow of solder into the receptacle portion 4 when the mounting portion 6 is soldered to the conductors 40 on the printed circuit board 36. The presence of solder in the receptacle portion of a connecting device is highly objectionable in that it can interfere with the proper functioning of the contact springs in the receptacle and may prevent insertion of the lead wire which the receptacle is designed to accept.

Connecting devices in accordance with the invention minimize the possibility of such undesirable solder flow by virtue of several features illustrated in FIG. 4 and 11. As shown in these Figures, the interior of the mounting portion faces in the opposite direction from the axes of the receptacle portion and the edges 34 extend laterally beyond the side 14 of the receptacle portion. It follows that to reach the receptacle portion of the connecting device, the solder would be required to flow around the corners defined by the sides 14 and the sides 8, 10. Furthermore, the lower edges 28 of the sides 8, 10 are disposed tightly against the upper surface of the printed circuit board so that solder can not flow between these edges and the upper surface the board.

As is noted above, the cross section of the cupped section or portion of the mounting leg is generally circular although the edges 33 thereof (FIG. 5) may depart from perfect circularity. The maximum outside radius of this cupped portion 30 is substantially equal to, and no less than, the diameter of the hole 38 in the printed circuit board 36 in which the device is to be mounted. When the receptacle device is inserted into the hole, the cupped portion 30 will be resiliently flexed and the ends 33 will assume a condition of substantially perfect circularity so that they will resiliently bear against the side of the hole 38. In this manner, the inserted device is mechanically firmly held in the hole 38 even before the printed circuit board is solder dipped to solder the inserted devices to the board. Upon soldering, solder 42 flows up into the interior of hole 38 and fills all of the space to the left of the mounting portion 30 and bonds the mounting portion to the conductors 40 on the underside of the printed circuit board 36.

As previously noted, connecting devices in accordance with the invention can be mounted as free standing parts on the printed circuit board 36 and will remain solidly in place prior to soldering so that the board can be manually handled for subsequent assembly operations such as the insertion of additional connecting devices and the insertion of other components. The solidity of the mounting is achieved as a result of several features of the disclosed embodiment. The cupped hemi-ellipsoidal mounting portion fits very snugly in the printed circuit hole 38 and provides a substantial bearing area, as is apparent from FIGS. 6, which is disposed against the internal surface of the hole. Moreover, this bearing area extends for a substantial length of the mounting leg which is apparent from FIG. 4 so that the mounting leg is firmly held in the hole. Additionally, the lower edges of the sides 8, 10 are disposed squarely against the upper surface of the printed circuit board thereby to prevent the device from rocking or shifting its position relative to the hole. As a result of these features, connecting devices can be mounted in holes as shown in FIG. 9 in precise locations corresponding to the leads 46 extending from an encapsulated integrated circuit device 44. The receptacles are normally inserted by automatic machines and after insertion and soldering, the integrated circuit device 44 can be assembled to the printed circuit board 36 by merely inserting the lead 46 into the individual receptacles. Connecting devices in accordances with the invention can be made in extremely small sizes. For example, the leads 46 of the integrated circuit device 44 commonly have a width of about 0.020 inch. A typical connecting device as shown in FIG. 9 has a width of about 0.07 inch along the sides 12, 14 and a width of about 0.065 inch along the sides 8, 10. Receptacles of this size are advantageously manufactured from suitable stock, such as phosphor bronze, having a thickness of 0.006 inch. Notwithstanding the extremely small size of the receptacles and the thinness of the stock from which they are manufactured, these devices are extremely rugged and will withstand normal or even abusive handling during the insertion operations.

The embodiment of the invention shown in FIGS. 1–7 has a receptacle portion 4 which is adapted to receive conductors having a generally rectangular cross section such as the conductors extending from an encapsulated integrated circuit device. Accordingly, one of the contact spring members 16 of this embodiment has its surface inwardly formed over a relatively wide area as shown at 22 so that a conductor having a rectangular cross section can be inserted between the two spring members. FIG. 10 shows an alternative embodiment in which one of the spring members has a V-shaped depression 58. A V-shaped depression is desirable on one of the contact spring members if the receptacle is intended to receive a conventional wire having a circular cross section. An inserted circular wire will establish three points of contact with the three surfaces presented by the contact springs of the embodiment of FIG. 10. It will be noted that in both embodiments, the spring members contact each other at their lower ends at two separated points rather than over a broad area. This is a desirable feature in that if the printed circuit board on which the receptacle is mounted is soldered with relatively high temperature solder and if the receptacles are preheated prior to soldering, there is a danger that the tin coating on the receptacles may be reflowed and the spring members may be fused together. The limited area of contact of the two spring members of FIGS. 7 and 10 decreases the possibility of such fusing and if it does take place, the spring members will be broken apart upon the insertion of the conductor.

FIGS. 8A–8F illustrate the stamping and forming of a single strip having two parallel columns of connecting devices, one column being on each side of a central carrier strip 50. The connecting devices are integral with transverse rungs or carrier strips 52 by means of connecting sections 54 and the central carrier strip 50 is advantageously provided with pilot holes 51 at equally spaced intervals to feed the strip through the forming die and, at a later time, through the inserting apparatus. It will be understood that connecting devices in accordance with the invention can also be manufactured as single end-to-end strips.

FIGS. 8A-8F also serve to illustrate the fact that connecting devices having improved mounting portions in accordance with the invention can readily be manufactured as one-piece devices rather than as two-piece devices as has been common practice in the past. The receptacle portion of the connecting device can be of a wide variety of types and have any suitable contact spring means therein to engage the inserted conductor. Whatever the type of receptacle, it should be noted that the connecting device will not have a seam, such as the seam 24 extending into or near the hole in the printed circuit board. The presence of a seam near or in the hole is undesirable in that solder tends to flow through the seam and fill the receptacle which, as previously noted, is a highly undesirable result.

The hemi-ellipsoidal form of the mounting portion 6 shown in the disclosed embodiment is particularly advantageous where the connecting devices are intended for use on printed circuit boards having punched holes. A punched hole in a printed circuit board is slightly conical and has a slightly larger diameter on one side than on the other. The hemi-ellipsoidal mounting portion of the devices shown in the drawing can be tightly fitted into such conical holes. When the holes are drilled in the printed circuit board, they will be cylindrical and under such circumstances it is preferable to form the mounting portions of the terminals as semi-cylinders dimensioned to fit snugly in the holes as shown in FIG. 6.

The arcuate extent of the mounting portion should be substantial in order to provide an extended bearing area between the side of the printed circuit board hole and the mounting portion. As shown in FIG. 6, the arcuate extend of the mounting portion is about 230° adjacent to the upper surface of the printed circuit board. A lesser arcuate extent may suffice under some circumstances but in any event this arc should be greater than 180°.

Notwithstanding the fact that connecting devices in accordance with the invention are extremely resistent to the flow of undesired solder into the receptacle portion of the connecting device, it is sometimes desirable to take additional precautions to prevent such solder flow. Particularly, where connecting devices are being mounted on printed circuit boards having plated through holes or on printed circuit boards having conductors on both surfaces thereof, there is a greater tendency for solder to flow into the receptacle portion of the connecting device than is the case where conductors are provided on only the underside of the board. Under such circumstances, a suitable solder resist coating may be applied to the upper surface of the stock metal 48 in FIG. 8A prior to stamping and forming the strip. It will be apparent from an inspection of 8A–8F that the surfaces of the blank which will have the solder resist coating ultimately become the internal surfaces of the receptacle portion 4 of the connecting device excepting that the opposed surfaces of the contact springs (which are bent around the underside of the blank) will not be so coated. In the finished connecting device then, the flow of solder up into the receptacle will be prevented by virtue of presence of solder resist coating on the internal surface of the receptacle. The righthand surface of the mounting portion 30′, as viewed in FIG. 12A, will also have a solder resist coating thereon but the leftwardly facing surface thereof will not and will be readily wetted by the solder.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. A one piece stamped and formed connecting device which is adapted to be mounted on a printed circuit board and soldered to a conductor on said board, said device comprising:

a receptacle portion and a mounting portion, said receptacle portion having a first wall and a pair of walls extending from said first wall in one direction, said mounting portion having a generally U-shaped cross section comprising a bight and sidewalls extending over at least a portion of its length, said bight being integral with said first wall, said sidewalls extending laterally in a direction other than said first direction and laterally beyond said first wall, said pair of walls having first lateral edges adjacent to said mounting portion which face the free end of said mounting portion, and said sidewalls having second lateral edges adjacent to said receptacle portion which face the free end of said receptacle edges, said first and second edges all being substantially in one plane whereby said device can be driven into a hole in a printed circuit board by application of a driving force to said second edges until said second edges are substantially flush with the surface of said board and said first edges are against said board.

2. A device as set forth in claim 1 wherein said mounting portion is generally hemi-ellipsoidal.

3. A device as set forth in claim 1 wherein said receptacle portion has a wall opposed to said first wall, said receptacle portion having resilient means therein for engagement with an inserted conductor.

4. A device as set forth in claim 1 wherein said receptacle has spring means extending from at least one of said walls and reversely bent to extend between said walls, said device having a solder resistant coating on the interior surfaces of said walls.

5. A one piece stamped and formed connecting device which is adapted to be mounted in a circular hole in a printed circuit board and soldered to a conductor on the side of said board which is opposite to the side on which said device is mounted, said device comprising:

a generally hemi-ellipsoidal mounting portion having, as viewed in transverse cross section, a bight and sidewalls, a receptacle portion having one side which merges with said bight of said mounting portion, said receptacle portion having additional sides which extend from the longitudinal edges of said one side, said one side and said additional side forming an enclosure which is adapted to receive a conductor, said enclosure having a longitudinal axis which is offset, in one lateral direction, from the longitudinal axis of said mounting portion, said sidewalls of said mounting portion being directed in a lateral direction opposite to said one direction whereby, upon inserting said mounting portion into said printed circuit board hole, said receptacle portion will be laterally offset from said hole, and upon soldering of said mounting portion to said conductor, solder will enter said mounting portion filling the space between said sidewalls and will be prevented from entering said receptacle portion.

6. A device as set forth in claim 5, said sidewalls providing edges intermediate the ends of said device which extend in said opposite direction laterally beyond said one wall of said receptacle portion, said edges providing driving surfaces for driving said device into said printed circuit board hole.

* * * * *

PO-1050
(5/69)

UNITED STATES PATENT OFFICE
CERTIFICATE OF CORRECTION

Patent No. 3,718,895 Dated February 27, 1973

Inventor(s) Charles Edward Reynolds et al

It is certified that error appears in the above-identified patent and that said Letters Patent are hereby corrected as shown below:

Column 8, line 59, the word "edges" (first occurrence) should be - - - portion - - -.

Signed and sealed this 12th day of March 1974.

(SEAL)
Attest:

EDWARD M.FLETCHER,JR.
Attesting Officer

C. MARSHALL DANN
Commissioner of Patents

P 2884